United States Patent
Cho et al.

(10) Patent No.: US 7,776,764 B2
(45) Date of Patent: Aug. 17, 2010

(54) SINGLE WALLED CARBON NANOTUBES COATED WITH DIELECTRIC SUBSTANCE AND TFT USING THEREOF

(75) Inventors: Gyoujin Cho, Jeollanam-do (KR); Sun Hee Kim, Jeollanam-do (KR); Eun Kyung Kim, Jeollanam-do (KR); Min-hun Jung, Jeollanam-do (KR)

(73) Assignee: Paru Co., Ltd, Jeollanam-do (KR)

( * ) Notice: Subject to any disclaimer, the term of this patent is extended or adjusted under 35 U.S.C. 154(b) by 94 days.

(21) Appl. No.: 11/870,252

(22) Filed: Oct. 10, 2007

(65) Prior Publication Data

US 2008/0099842 A1    May 1, 2008

(30) Foreign Application Priority Data

Oct. 31, 2006   (KR) ...................... 10-2006-0106023

(51) Int. Cl.
*H01L 21/31*    (2006.01)
(52) U.S. Cl. .................. 438/780; 438/149; 977/750
(58) Field of Classification Search ................. 438/149, 438/780; 977/750
See application file for complete search history.

(56) References Cited

U.S. PATENT DOCUMENTS

2007/0004857 A1*   1/2007   Barraza et al. .............. 524/847

* cited by examiner

*Primary Examiner*—Alexander G Ghyka
(74) *Attorney, Agent, or Firm*—The Webb Law Firm

(57) ABSTRACT

The present invention relates to a technology for printing a thin film transistor (TFT) using single walled carbon nanotubes coated with dielectric substance having a thickness of several nm and thus capable of improving significantly a low on/off ratio of an existing single walled carbon nanotube TFT.

5 Claims, 6 Drawing Sheets

Before coating            After coating

SINGLE WALLED CARBON NANOTUBES COATED WITH DIELECTRIC SUBSTANCE AND TFT USING THEREOF

TECHNICAL FIELD

The present invention relates to a manufacture of a printed thin film transistor that is a very important unit for building devices in printed electronic devices. More specifically, the present invention relates to a technology for printing a thin film transistor (TFT) using single walled carbon nanotubes coated with dielectric substance having a thickness of several nm and thus capable of improving significantly a low on/off ratio of an existing single walled carbon nanotube TFT.

BACKGROUND ART

A thin film transistor includes a gate electrode, a drain electrode, a source electrode, a dielectric film (an insulation layer) and an active layer (a semiconductor). In printed electronic devices, all of these components are manufactured by printing. At this time, the performance of a transistor depends on the charge mobility of the active layer and the on/off ratio, which is one of the main characteristics of the transistor, depends on the respective printed components of the transistor.

Up to now, the highest characteristics of the thin film transistor, 100% of which is manufactured using a printing process known around the world are that the mobility is 0.01 $cm^2/Vs$ and the on/off ratio is $10^6$. At this time, an organic material is mainly used as the active layer and poly(3-hexyl thiopene) has shown the most stable value. Also, polyvinylphenol is used as the dielectric material, which is the insulation layer having an important influence on the on/off ratio.

To the contrary, the on/off ratio of the printed transistor using single walled carbon nanotubes (SWNTs) as network morphology is about 10. However, up to now, the mobility of this thin film transistor is relatively high (1~200 $cm^2/Vs$). Although printed SWNTs transistors have a high mobility, they cannot meet the requirements by the device to be used mainly due to their low on/off ratio. As a result, it is a very serious problem that should be overcome in order to commercialize the printed electronic devices.

Therefore, active studies have been made to a technology for applying various organic semiconductors. Among others, studies for applying single walled carbon nanotubes to the printed electronic devices have been in active progress since the charge mobility has been reported upto more than 10000 $cm^2/Vs$ when one single walled carbon nanotube has been used as a semiconductor. However, it is now difficult to apply the single walled carbon nanotubes to the printed electronic devices since metal component and semiconductor component are mixed in the single walled carbon nanotubes at a ratio of 1:3 when manufactured and a high-cost process is used to remove the metal component from the single walled carbon nanotubes and it is difficult to completely remove the metal component. Further, the transistor having the on/off ratio of $10^6$ or more can be manufactured when using one single walled carbon nanotube on Si substrate, however, there is a fatal problem that the transistor cannot perform its role since a network is formed among the nanotubes and thus serves as a nano scale capacitor when massive single walled carbon nanotubes are used to print electronic devices.

DISCLOSURE OF THE INVENTION

It is an object of the present invention to provide a technology of solving problems of removal of fatal metallic tube and nano capacitor formation between tubes caused when manufacturing a printed transistor using single walled carbon nanotubes through an inexpensive and simple one time process for coating polymer dielectric substance nano thin film.

It is another object of the present invention to provide a method of forming a nano dielectric thin film on single walled carbon nanotubes and a method of printing a thin film transistor using the single walled carbon nanotubes coated with the dielectric thin film.

The present invention relates to a technology that provides a method of effectively coating polymer dielectric substance of nanometer thickness on single walled carbon nanotubes and prints it so as to serve as a semiconductor layer when manufacturing a thin film transistor.

There has been found that a thin film transistor with significantly improved on/off ratio can be manufactured through a coating of single walled carbon nanotubes according to the present invention and a printing process using the same, thereby completing the present invention.

The present invention is a technology in which polymer dielectric substance is constantly coated as a nano thin film on each of single walled carbon nanotubes at a thickness of 1 to 1 nm, more preferably 1 to 5 nm using water dispersed single walled carbon nanotubes (SWNT) and a monomolecular film of an anionic surfactant adsorbed thereto as a mold and thus the metal property of a metallic tube is not revealed and at the same time, a semiconductor tube is coated with dielectric substance which is insulation layer substance, thereby permitting the single walled carbon nanotubes to serve as a semiconductor layer in a transistor with or without a separate insulation layer.

The present invention is a technology, in which in order to perform a coating at a constant thickness and to obtain an inexpensive and uniform coating result even in repeated coating when coating polymer dielectric substance as a nano thin film on a surface of a carbon nanotube, anionic surfactant is absorbed to a surface of a water dispersed single walled carbon nanotube to form monomolecular film and then monomer of polymer dielectric substance to be coated is added and thus the monomer is condensed and then polymerized on surfactant monomolecular film capable of being thermodynamically more stable to be constantly grown to the polymer dielectric thin film with a nano thickness. FIG. 1 is a simple systematic view of this process.

In other words, the present invention provides a method for manufacturing single walled carbon nanotubes coated with polymer dielectric substance comprising the steps of:

a) manufacturing water dispersion containing surfactant and the single walled carbon nanotubes;

b) adding monomer of polymer dielectric substance to the water dispersion and agitating it; and c) polymerizing the monomer.

In the present invention, the monomer can be used without limitation if it is monomer of resin generally usable as dielectric substance. Preferably, it may include at least any one selected from styrene, methyl methacrylate, acrylate, alpha-olefin, vinyl chloride, propylene, tetrafluoroethylene, vinyl pyrollidine.

Further, as the surfactant, sulfonate-based anionic surfactant, sulfate-based anionic surfactant, phosphite-based anionic surfactant, dithiocarbonate-based anionic surfactant, etc., may be used and more preferably sodium dodecyl sulfate may be used. At this time, in the present invention, though cationic surfactant may also be used as the surfactant, at least one selected from cetyl pyridinium chloride, Cetyl pyridinium bromide, cetyl and trimethyl ammonium bromide, it is more preferable to use the anionic surfactant since the carbon nanotubes are more stable in anion.

In the carbon nanotube coated with polymer dielectric substance nano thin film generated through the process of FIG. 1 according to the present invention, it is possible to variously coat polymer dielectric substance on a surface of the tube according to the dielectric substance single molecules (monomer) to be added. Preferably, the single walled carbon nanotube coated with polystyrene, poly methyl methacrylate or poly acrylate may be manufactured. The a transmission electron microscope observation results of the thickness and uniformity of the coating of the single walled carbon nanotube coated with polymer dielectric substance through this manufacturing method are shown in FIG. 2. At this time, the thickness of the coated thin film can be simply controlled by controlling the amount of the single molecules to be added. The thickness of coated thin film is 1 to 10 nm and more preferably 1 to 5 nm. FIG. 2 shows a transmission electron microscope image of single walled carbon nanotubes without coating and single walled carbon nanotubes coated with polymer dielectric substance nano thin film. As can clearly be appreciated from FIG. 2, the polymer dielectric substance constantly and uniformly coated at a thickness of 1 to 2 nm can be confirmed.

The coated single walled carbon nanotube in the water dispersed form manufactured by the method of the present invention can be directly used as ink for an inkjet printer without performing a special formulation for printing the active layer (semiconductor layer) in the structure shown in FIG. 3. The ink is directly printed on the upper portions of printed drain and source electrodes and then a gate electrode is printed thereon, or the gate electrode is printed and then dielectric layer printed. Consequently, the drain and source electrodes are printed thereon and then, the ink is directly printed thereon with or without having the insulation layer, thereby manufacturing the transistor.

One example of the manufactured transistor is shown in FIG. 4.

In other words, one aspect of the present invention comprises: a substrate; drain and source electrodes printed on the upper portion of the substrate; a semiconductor layer printed with the ink on the upper portions of the drain and source electrodes; and a gate electrode printed on the upper portion of the semiconductor layer.

Another aspect of the present invention comprises: a substrate; a gate electrode printed on the upper portion of the substrate; a gate dielectric layer printed on the upper portion of the gate electrode; drain and source electrodes printed on the upper portion of the gate dielectric layers; a semiconductor layer printed with the ink on the upper portion of the drain electrode and the source electrode.

At this time, when using the ink in the present invention, since the single walled carbon nanotube is coated with dielectric substance, it is not necessary or necessary to form a separate insulation layer depending on the required transistor characteristics. Also, when forming the semiconductor layer, the thickness of the printed semiconductor layer is, not limited to, preferably 10 to 200 nm, which gives an advantage that the output current value and the on/off ratio can simultaneously be increased while a network is formed between the nanotubes.

BEST MODE FOR CARRYING OUT THE INVENTION

Hereinafter, the present invention will be described in detail with reference to the examples, but the present invention is not limited to the following examples.

Manufacturing Example

Manufacture of Single Walled Carbon Nanotubes Coated with Polymer Dielectric Nano Thin Film Anionic surfactant (sodium dodecyl sulfate) of 3 g and single walled carbon nanotube of 0.1 g with an average length of 10 μm and an average diameter of 2 nm were added and dispersed to water of 100 g. Styrene of 8.64 mole which passed through an alumina column was put therein and they were reacted for 6 hours while agitating them. Thereafter, as initiator, 2,2'-azobisisobutyronitrile of 0.0864 mole was put therein and they were reacted for 12 hours while agitating them in a reactor at 60° C.

Figure 1:
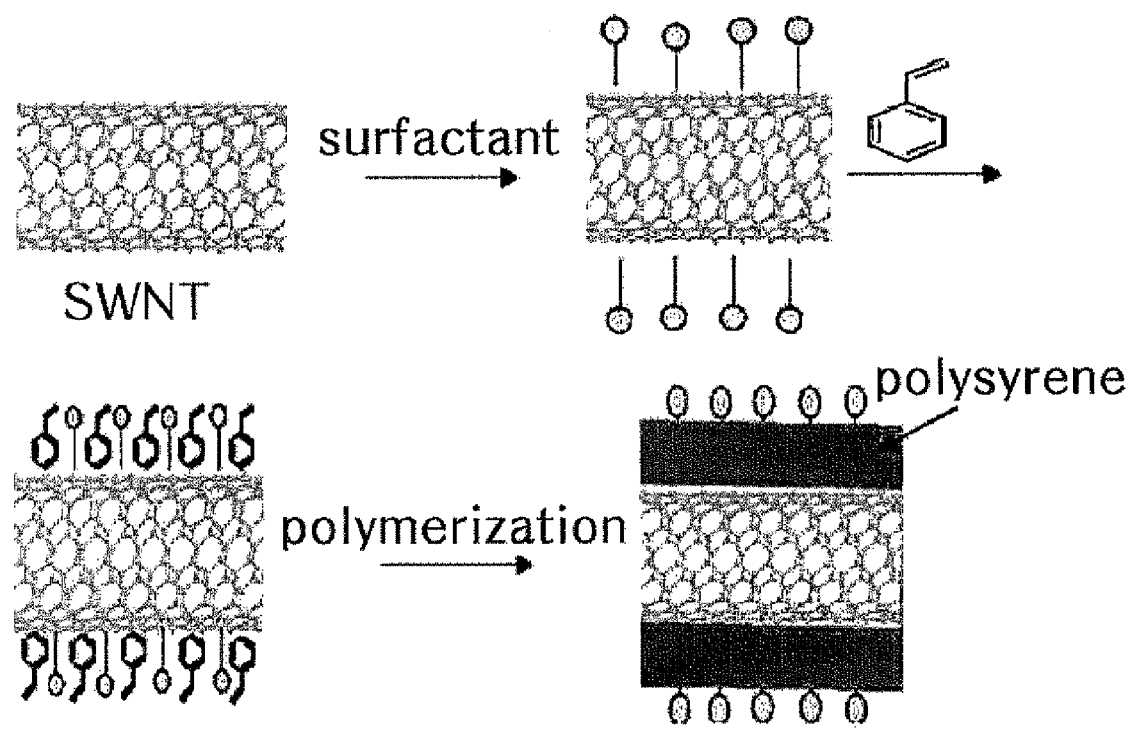
FIG. 1 is a systematic view showing a technology of coating individual single walled carbon nanotube with polymer dielectric thin film used in the present invention.
Figure 2:
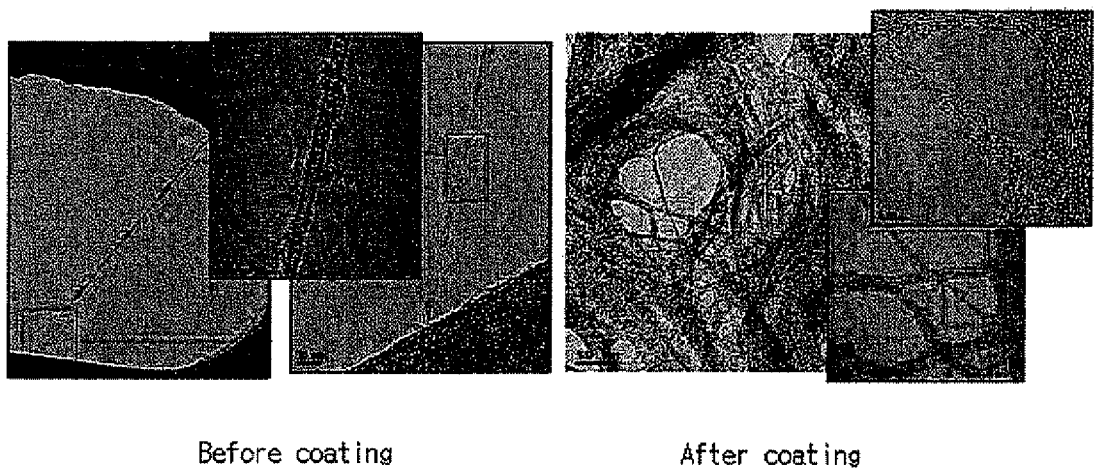
FIG. 2 is a transmission electron microscope image showing single walled carbon nanotubes coated with a nano polymer dielectric thin film manufactured according to the present invention and single walled carbon nanotubes before a coating is performed.
Figure 3:
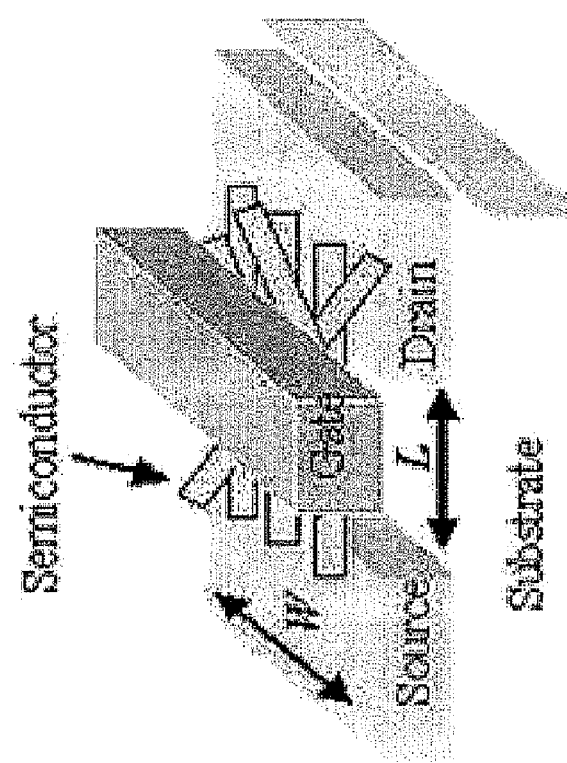
FIG. 3 is a structural view showing a thin film transistor printed using the single walled carbon nanotubes coated with a nano polymer thin film used in the present invention.
Figure 3:
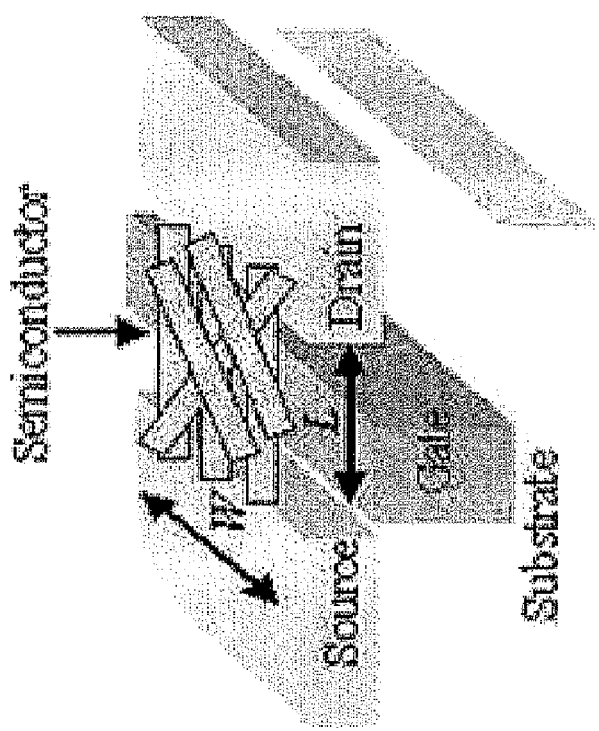
Figure 4:
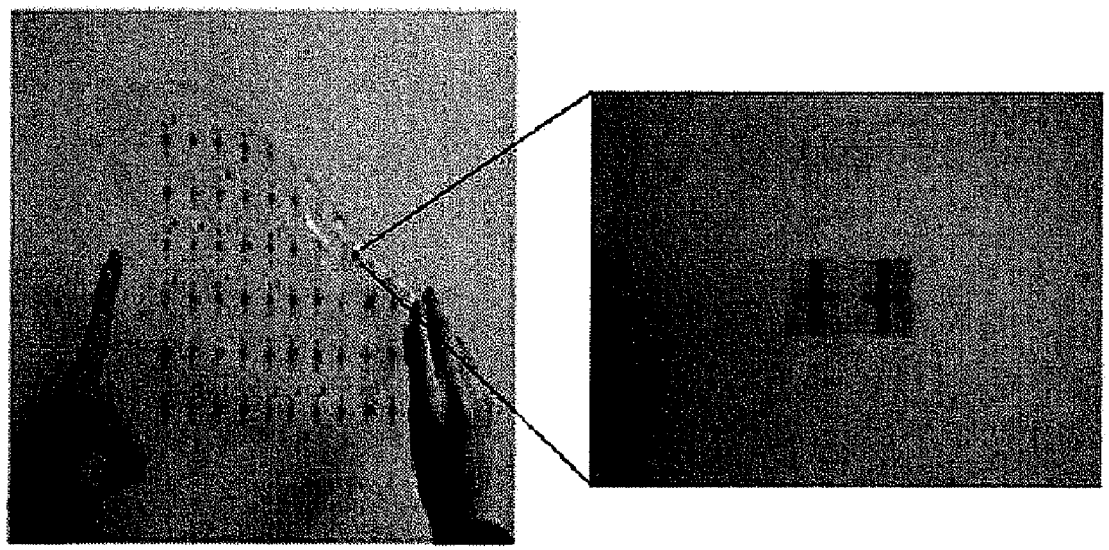
FIG. 4 is an image of the single walled carbon nanotube transistor image coated with a nano polymer thin film printed according to the present invention.

As the result, as shown in FIG. 2, it could be confirmed that the polymer dielectric substance constantly and uniformly coated at a thickness of about 2 mm.

Example

Printing Transistor Using Single Walled Carbon Nanotubes Coated with Polymer Dielectric Nano Thin Film In the structure of the transistor using the single walled carbon nanotubes coated with polymer dielectric substance manufactured in the manufacturing example, a drain-source electrode, a semiconductor layer and a gate electrode, which are the components of the transistor, was printed sequentially and an insulation layer which is a dielectric layer was replaced by the carbon nanotubes coated with polymer dielectric substance nano thin film and thus a process for manufacturing separately the insulation layer can be omitted, which allows a significant reduction in thickness as compared to other existing polymer insulation layer.

First, a flexible polyimide film having a thickness of 25 μm was used as the substrate. The drain-source electrode was printed on the polyimide substrate using ink in which sodium dodecyl surface (SDS) of 4 g and bundle carbon nanotube of 0.5 g are dispersed in water of 10 g to form source/drain electrode. a resistance per area of respective printed electrode was 10 kΩ, a channel length was 100 μm, and a channel width was 2000 μm.

The ink of single walled carbon nanotube coated with polymer dielectric substance nano thin film manufactured in the manufacturing example was printed on a channel at a thickness of 50 nm to form the active layer formed with the network, and the gate electrode with sheet resistance of 0.002 ohm/sq/mil was formed on the manufactured device using silver nano ink made by dispersing silver nano particles with an average particle diameter of 50 nm, which is made using silver nitrate and reducer, in water using the surfactant (sodium dodecyl sulfate), thereby manufacturing the transistor using the ink of single walled carbon nanotube coated with polymer dielectric substance nano thin film.

Characteristics of the transistor, printed in the present invention, using the ink of single walled carbon nanotube coated with the printed polymer dielectric substance nano thin film were analyzed using a semiconductor characterization analyzer KEITHLEY 4200.

Figure 5:
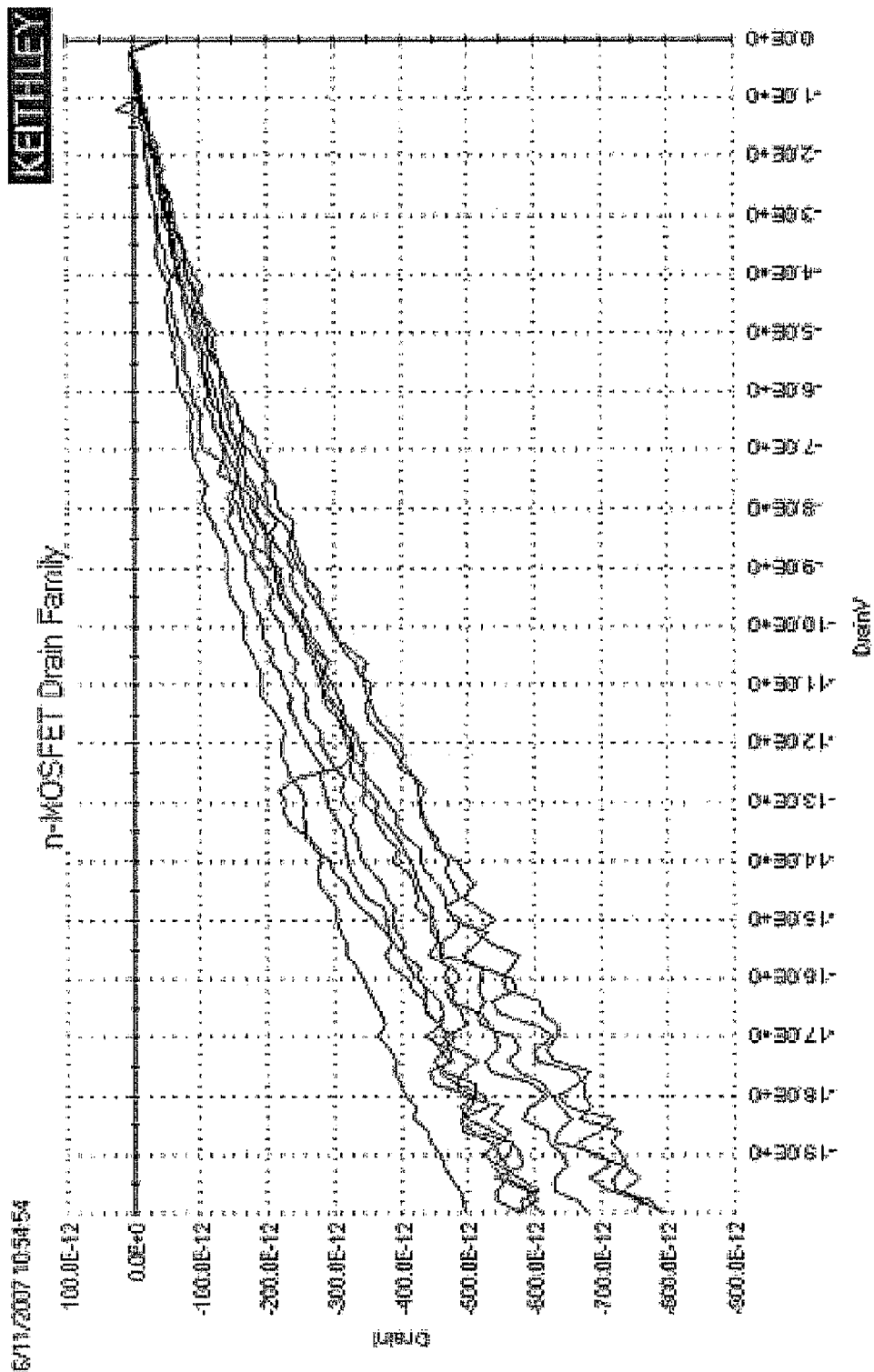
FIG. 5 is a current-voltage characteristic analysis graph of a single walled carbon nanotubes transistor not coated with a nano polymer thin film printed in the present invention with applying 10 to 80 V of gate fields.
Figure 6:
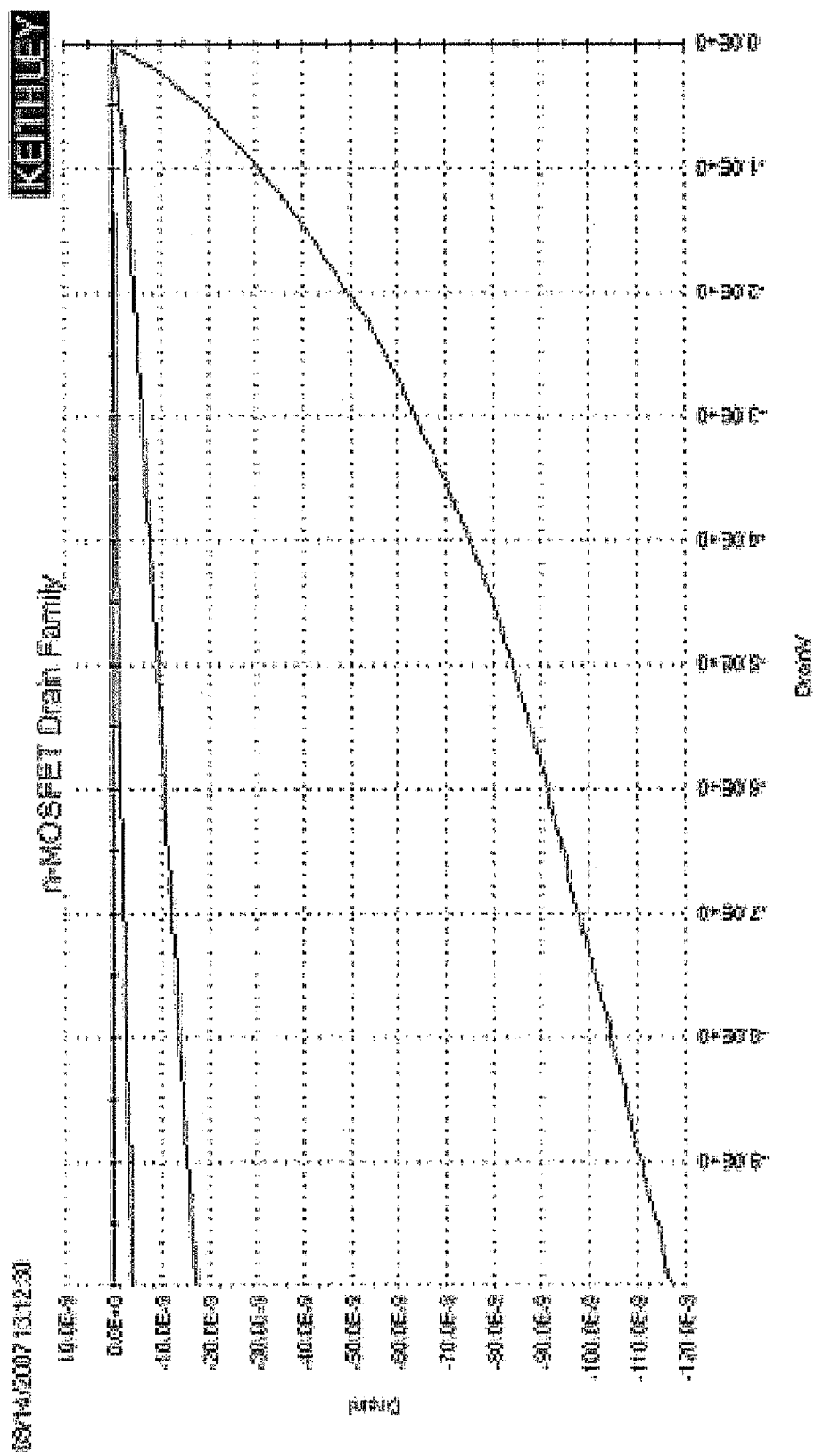
FIG. 6 is a current-voltage characteristic analysis graph of a single walled carbon nanotubes transistor coated with a nano polymer thin film printed in the present invention with applying 1 to 10 V of gate fields.

In order to compare the characteristics of the transistor printed using the technology of the present invention, the characteristics of the transistor using the single walled carbon nano tube which is not coated were measured and the results are shown in FIG. 5.

As shown in FIG. 5, in the case of the single walled carbon nanotube which is not coated, there was shown no gate effect and this is because the metallic single walled carbon nanotubes existed together and thus the characteristics of the semiconductor single walled carbon nanotube were not revealed.

However, when using the single walled carbon nanotube coated according to the examples of the present invention as the semiconductor layer, it could be appreciated that the gate effect was clearly revealed and the on/off ratio was approximately 200 times than that in FIG. 5.

At this time, when calculating the charge mobility of the transistor using the following mobility calculation equation, high mobility of 260 cm²/Vs was shown.

$$I_{D,sat} = \frac{W \mu C_o}{2L}(V_G - V_T)^2$$

EFFECT OF INVENTION

A printing was performed on the upper portion of drain and source electrodes by using the single walled carbon nanotubes coated with polymer dielectric substance at a thickness of nanometers according to the present invention as ink to manufacture a thin film transistor, and as the result, it possible to obtain the thin film transistor with excellent charge mobility and on/off ratio.

Also, when using the single walled carbon nanotube coated with polymer dielectric substance as ink, since the metal property of metallic tube is not revealed and the nano tubes are coated with insulation layer substance, a separate insulation layer is not required when manufacturing the thin film transistor and thus it is possible to reduce significantly the thickness of the insulation layer.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A method of preparing an ink for printing a semiconductor layer of a thin-film transistor, comprising the steps of:
    a) preparing a water dispersion comprising a surfactant and a plurality of single walled carbon nanotubes wherein the surfactant is adsorbed on the single walled carbon nanotubes and is ca able of actin as a template for at least one of a plurality of monomers of a polymer dielectric substance;
    b) adding the plurality of monomers of the polymer dielectric substance to the water dispersion and agitating it; and
    c) polymerizing the added plurality of monomers such that the single walled carbon nanotubes having the surfactant adsorbed thereon are coated with a thickness of the polymer dielectric substance, wherein the thickness of the polymer dielectric substance coated on the surface of the single walled carbon nanotubes is controlled by the addition amount of the monomer of the polymer dielectric substance added to the water dispersion, wherein said ink is formed.

2. The method as set forth in claim 1, wherein the plurality of monomers of the polymer dielectric substance includes at least one selected from the group consisting of styrene, methyl methacrylate, acrylate, alpha-olefin, vinyl chloride, propylene, vinyl pyrollidine and tetrafluoroethylene.

3. The method as set forth in claim 1, wherein the surfactant includes at least one anionic surfactant selected from the group consisting of sulfonate-based anionic surfactant, sulfate-based anionic surfactant, phosphite-based anionic surfactant and dithiocarbonate-based anionic surfactant or at least one cationic surfactant selected from cetyl pyridinium chloride, cetyl pyridinium bromide, cetyl and trimethyl ammonium bromide.

4. The method for preparing an ink for printing a semiconductor layer of a thin-film transistor according to claim 1, wherein the polymer dielectric substance coated on the surface of the single walled carbon nanotubes has a thickness of 1 to 10 nm.

5. The method for preparing an ink for printing a semiconductor layer of a thin-film transistor according to claim 4, wherein the polymer dielectric substance coated on the surface of the single walled carbon nanotubes insulates a gate of the thin-film transistor from the single walled carbon nanotubes.

* * * * *

UNITED STATES PATENT AND TRADEMARK OFFICE
CERTIFICATE OF CORRECTION

PATENT NO.       : 7,776,764 B2  
APPLICATION NO.  : 11/870252  
DATED            : August 17, 2010  
INVENTOR(S)      : Cho et al.

Page 1 of 1

It is certified that error appears in the above-identified patent and that said Letters Patent is hereby corrected as shown below:

Column 6, line 20, Claim 1, "is ca able of actin" should read -- is capable of acting --

Signed and Sealed this
Twenty-fifth Day of January, 2011

David J. Kappos
*Director of the United States Patent and Trademark Office*